United States Patent
Qin

(10) Patent No.: US 10,586,936 B2
(45) Date of Patent: Mar. 10, 2020

(54) FLEXIBLE SUBSTRATE AND MANUFACTURING METHOD THEREOF

(71) Applicant: Wuhan China Star Optoelectronics Technology Co., Ltd., Wuhan (CN)

(72) Inventor: Fang Qin, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 417 days.

(21) Appl. No.: 15/505,111

(22) PCT Filed: Dec. 28, 2016

(86) PCT No.: PCT/CN2016/112527
§ 371 (c)(1),
(2) Date: Feb. 20, 2017

(87) PCT Pub. No.: WO2018/103155
PCT Pub. Date: Jun. 14, 2018

(65) Prior Publication Data
US 2019/0157583 A1    May 23, 2019

(30) Foreign Application Priority Data
Dec. 9, 2016  (CN) .......................... 2016 1 1131133

(51) Int. Cl.
*H01L 51/00* (2006.01)
*H01L 51/56* (2006.01)
*H01L 27/32* (2006.01)

(52) U.S. Cl.
CPC ...... *H01L 51/0097* (2013.01); *H01L 27/3244* (2013.01); *H01L 51/56* (2013.01)

(58) Field of Classification Search
CPC ......... H01L 51/0097; H01L 2251/5338; H01L 51/50
See application file for complete search history.

(56) References Cited

U.S. PATENT DOCUMENTS

2013/0112966 A1* 5/2013 Sassa ................. H01L 51/5092
257/40
2014/0323006 A1  10/2014 Song et al.
(Continued)

FOREIGN PATENT DOCUMENTS

CN    103681733 A    3/2014
CN    105552225 A    5/2016

*Primary Examiner* — Walter H Swanson
(74) *Attorney, Agent, or Firm* — Leong C. Lei

(57) ABSTRACT

The present invention provides a flexible substrate and a manufacturing method thereof. The flexible substrate is divided into a first organic material layer (21) and a second organic material layer (22). A coverage area of the second organic material layer (22) on a carrying plate (1) is greater than a coverage area of the first organic material layer (21) on the carrying plate (1) and a major, long edge of the second organic material layer (22) encloses a major, long edge of the first organic material layer (21) so as to help reduce the thickness of an edge of the flexible substrate and prevent etching residue at an edge, reduce the coverage area of the organic materials on the carrying plate, and reduce warpage of the flexible substrate. Further, an alignment mark (3) is formed on the second organic material layer (22) at a location between the major, long edge of the first organic material layer (21) and the major, long edge of the second organic material layer (22) to ensure alignment accuracy in subsequent processes, such as vapor deposition. Further, since there is only one layer of organic material at the site of alignment mark (3), light transmission rate is increased and the rate of successful alignment is enhanced.

7 Claims, 2 Drawing Sheets

(56) References Cited

U.S. PATENT DOCUMENTS

| | | | |
|---|---|---|---|
| 2015/0210048 A1* | 7/2015 | Jeong | B32B 7/06 |
| | | | 428/212 |
| 2017/0181338 A1* | 6/2017 | Tomita | B23P 19/04 |
| 2018/0198096 A1* | 7/2018 | Yasuda | G02F 1/1339 |
| 2018/0240852 A1* | 8/2018 | Chen | H01L 51/50 |

* cited by examiner

FLEXIBLE SUBSTRATE AND MANUFACTURING METHOD THEREOF

BACKGROUND OF THE INVENTION

1. Field of the Invention

The present invention relates to the field of display technology, and more particular to a flexible substrate and a manufacturing method thereof.

2. The Related Arts

Organic light emitting display (OLED) is a display technology of prosperous future of development for it has excellent displaying performance and also shows various advantages including being self-luminous, simple structure, being ultra light and thin, fast response speed, wide view angle, low power consumption and realization of flexible displaying and is thus regarded as a "dream display", attracting attention of major display manufacturers, making it the main force of the third generation displays in the field of display technology.

A flexible OLED display device requires formation of an arrayed arrangement of pixel structures on a substrate and each pixel structure generally comprises components including a thin-film transistor (TFT) and a capacitor.

Currently, a flexible OLED display device is generally manufactured based on a substrate of an organic material and the organic material substrate is disposed on a carrying glass plate. The organic material substrate and the carrying glass plate have differences therebetween in respect of characteristics thereof. In addition, to in the manufacture of a low temperature poly-silicon (LTPS) flexible OLED display device, high temperature processes, such as excimer laser annealing (ELA) and hydrogen activation, must be involved so that the flexible organic material substrate would undergo shrinking. Thus, it is necessary to make various positioning marks on the organic material substrate to ensure alignment accuracy in the subsequent processes (such as alignment for OLED vapor deposition). However, the larger the area that the organic material substrate covers the carrying glass plate, the greater the warpage that organic material substrate may generate in an array process and the lower the manufacturing yield. Thus, it is necessary to ensure that while various positioning marks are made on the organic material substrate, the coverage area thereof on the carrying glass plate can be reduced as much as possible.

Based on the design and specification applied in actual manufacturing, taking an alignment mark of OLED vapor deposition among a series of marks that are closest to an edge of a substrate as an example, since the organic material used in a flexible organic material substrate has a relatively large viscosity, the edge of the flexible organic material substrate has a very steep angle, readily leading to etching residue at this site. Further, since the flexible organic material substrate that is used in the contemporary LTPS flexible OLED display device is often a colorful temperature-resistant organic material, in alignment for vapor deposition, alignment light gets incident from a back side of the flexible organic material substrate, transmitting through the colorful flexible organic material substrate may lead to loss of light, so as to reduce the reflection rate of the alignment mark and thus affecting the rate of successful alignment.

SUMMARY OF THE INVENTION

An objective of the present invention is to provide a flexible substrate, which helps improve alignment accuracy and product yield, increases light transmission rate, enhances rate of correct alignment, reduces warpage, and prevents etching residue occurring at edges.

Another objective of the present invention is to provide a manufacturing method of a flexible substrate, which may manufacture a flexible substrate that improves alignment accuracy and product yield, increases light transmission rate, enhances rate of correct alignment, reduces warpage, and prevents etching residue occurring at edges.

To achieve the above objectives, the present invention provides a flexible substrate, which comprises a first organic material layer laid on the carrying plate and a second organic material layer completely covering the first organic material layer, wherein a coverage area of the second organic material layer on the carrying plate is greater than a coverage area of the first organic material layer on the carrying plate and a major edge of the second organic material layer encloses a major edge of the first organic material layer.

A distance between the major edge of the second organic material layer and the corresponding major edge of the first organic material layer is not less than 3 mm.

The second organic material layer is provided thereon with an alignment mark at a location between the major edge thereof and the major edge of the first organic material layer.

The carrying plate comprises a glass plate.

The first organic material layer and the second organic material layer are each formed of a material comprising polyimide.

The present invention also provides a manufacturing method of a flexible substrate, which comprises the following steps:

Step S1: provides a carrying plate and coating and curing a first organic material layer on the carrying plate; and Step S2: coating and curing a second organic material layer on the first organic material layer and the carrying plate;

wherein the second organic material layer completely covers the first organic material layer; and a coverage area of the second organic material layer on the carrying plate is greater than a coverage area of the first organic material layer on the carrying plate and a major edge of the second organic material layer encloses a major edge of the first organic material layer.

The manufacturing method of the flexible substrate further comprises:

Step S3: depositing a barrier layer on the second organic material layer and the carrying plate; and Step S4: in an array process, forming an alignment mark on the second organic material layer at a location between the major edge of the first organic material layer and the major edge of the second organic material layer.

A distance between the major edge of the second organic material layer and the corresponding major edge of the first organic material layer is not less than 3 mm.

The carrying plate comprises a glass plate.

The first organic material layer and the second organic material layer are each formed of a material comprising polyimide.

The present invention further provides a flexible substrate, which comprises a first organic material layer laid on the carrying plate and a second organic material layer completely covering the first organic material layer, wherein a coverage area of the second organic material layer on the carrying plate is greater than a coverage area of the first organic material layer on the carrying plate and a major edge of the second organic material layer encloses a major edge of the first organic material layer;

wherein the carrying plate comprises a glass plate; and wherein the first organic material layer and the second organic material layer are each formed of a material comprising polyimide.

The efficacy of the present invention is that the present invention provides a flexible substrate, in which the flexible substrate is divided into a first organic material layer and a second organic material layer, and a coverage area of the second organic material layer on a carrying plate is greater than a coverage area of the first organic material layer on the carrying plate and a major, long edge of the second organic material layer encloses a major, long edge of the first organic material layer to help reduce the thickness of an edge of the flexible substrate and prevent etching residue at an edge, reduce the coverage area of the organic materials on the carrying plate, and reduce warpage of the flexible substrate. Further, an alignment mark is formed on the second organic material layer at a location between the major, long edge of the first organic material layer and the major, long edge of the second organic material layer such that in case of film shrinking occurring in the flexible substrate, it is possible to ensure alignment accuracy in subsequent processes, such as vapor deposition. Further, since there is only one layer of organic material at the site of the alignment mark, light transmission rate is increased to thereby improve reflection rate at the alignment mark and thus enhance the rate of successful alignment. The present invention provides a manufacturing method of a flexible substrate, in which a flexible substrate is coated with two layers and a flexible substrate manufactured with such a method has relatively high alignment accuracy and product yield, relatively high light transmission rate, better successful rate of alignment, reduced warpage, and less etching residue occurring at an edge.

BRIEF DESCRIPTION OF THE DRAWINGS

For better understanding of the features and technical contents of the present invention, reference will be made to the following detailed description of the present invention and the attached drawings. However, the drawings are provided only for reference and illustration and are not intended to limit the present invention.

In the drawings.

DETAILED DESCRIPTION OF THE PREFERRED EMBODIMENTS

To further expound the technical solution adopted in the present invention and the advantages thereof, a detailed description will be given with reference to the preferred embodiments of the present invention and the drawings thereof.

Figure 1:
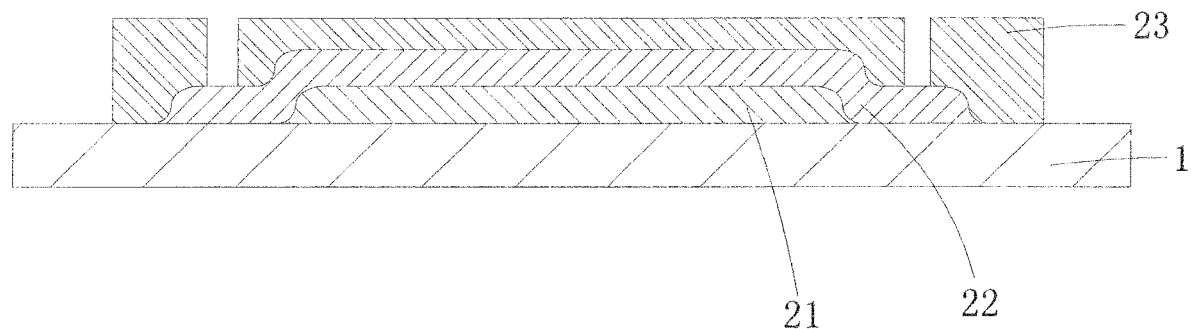
FIG. 1 is a primary view showing a flexible substrate according to the present invention.
Figure 2:
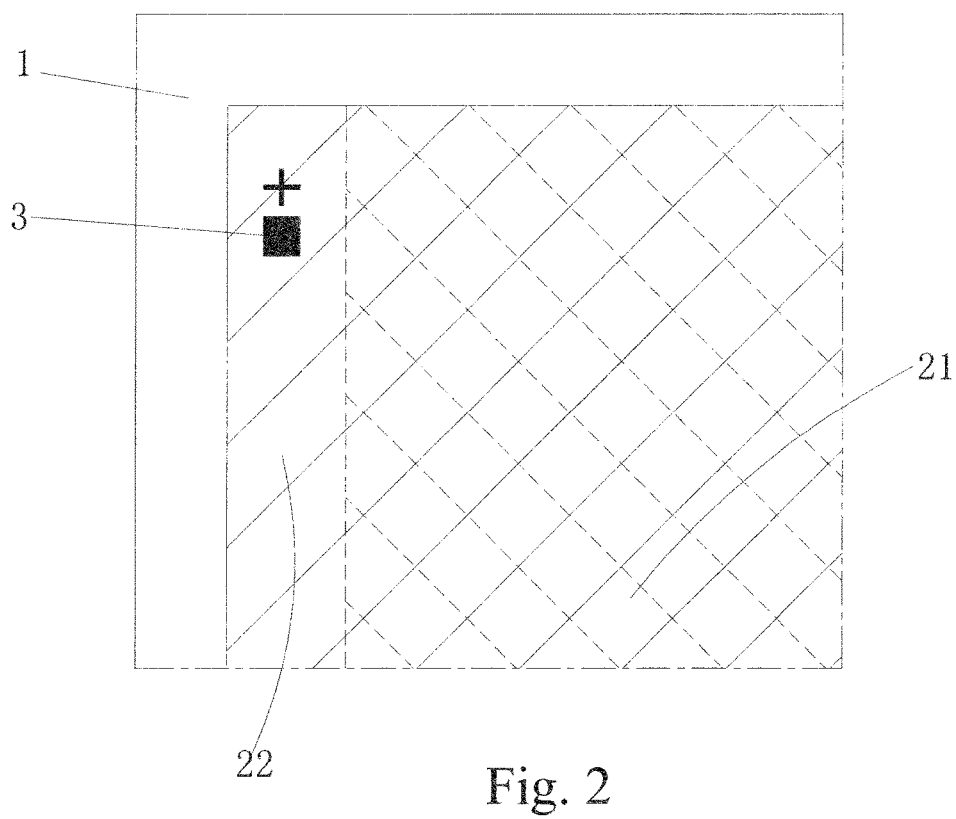
FIG. 2 is a top plan view showing one quarter area of the flexible substrate according to the present invention.

Referring simultaneously to FIGS. 1 and 2, firstly, the present invention provides a flexible substrate, which comprises a first organic material layer 21 laid on a carrying plate 1 and a second organic material layer 22 completely covering the first organic material layer 21. A coverage area of the second organic material layer 22 on the carrying plate 1 is greater than a coverage area of the first organic material layer 21 on the carrying plate 1 and a major, long edge of the second organic material layer 22 surrounds a major, long edge of 圄 the first organic material layer 21.

Specifically, the carrying plate 1 is preferably a glass plate; and the first organic material layer 21 and the second organic material layer 22 are each formed of a material that comprises, but is not limited to, polyimide (PI).

A distance between a major edge of the second organic material layer 22 and the corresponding major edge of the first organic material layer 21 is not less than 3 mm. This arrangement helps reduces a thickness of the flexible substrate at the edge so as to prevent etching residue at the edge of the flexible substrate and also to reduce the coverage area of the organic materials on the carrying plate 1 to reduce warpage of the flexible substrate.

It is noted that the second organic material layer 22 is provided with an alignment mark 3 at a location between the major edge thereof and the major edge of the first organic material layer 21. The alignment mark 3 does not overlap the first organic material layer 21 in a direction substantially perpendicular to the carrying plate 1. In case of film shrinking occurring in the flexible substrate, the presence of the alignment mark 3 helps ensure alignment accuracy in subsequent processes, such as vapor deposition. Further, since there is only one layer of organic material at the site of the alignment mark 3, light transmission rate is increased to thereby improve reflection rate at the alignment mark 3 and thus enhance the rate of successful alignment.

Figure 3:
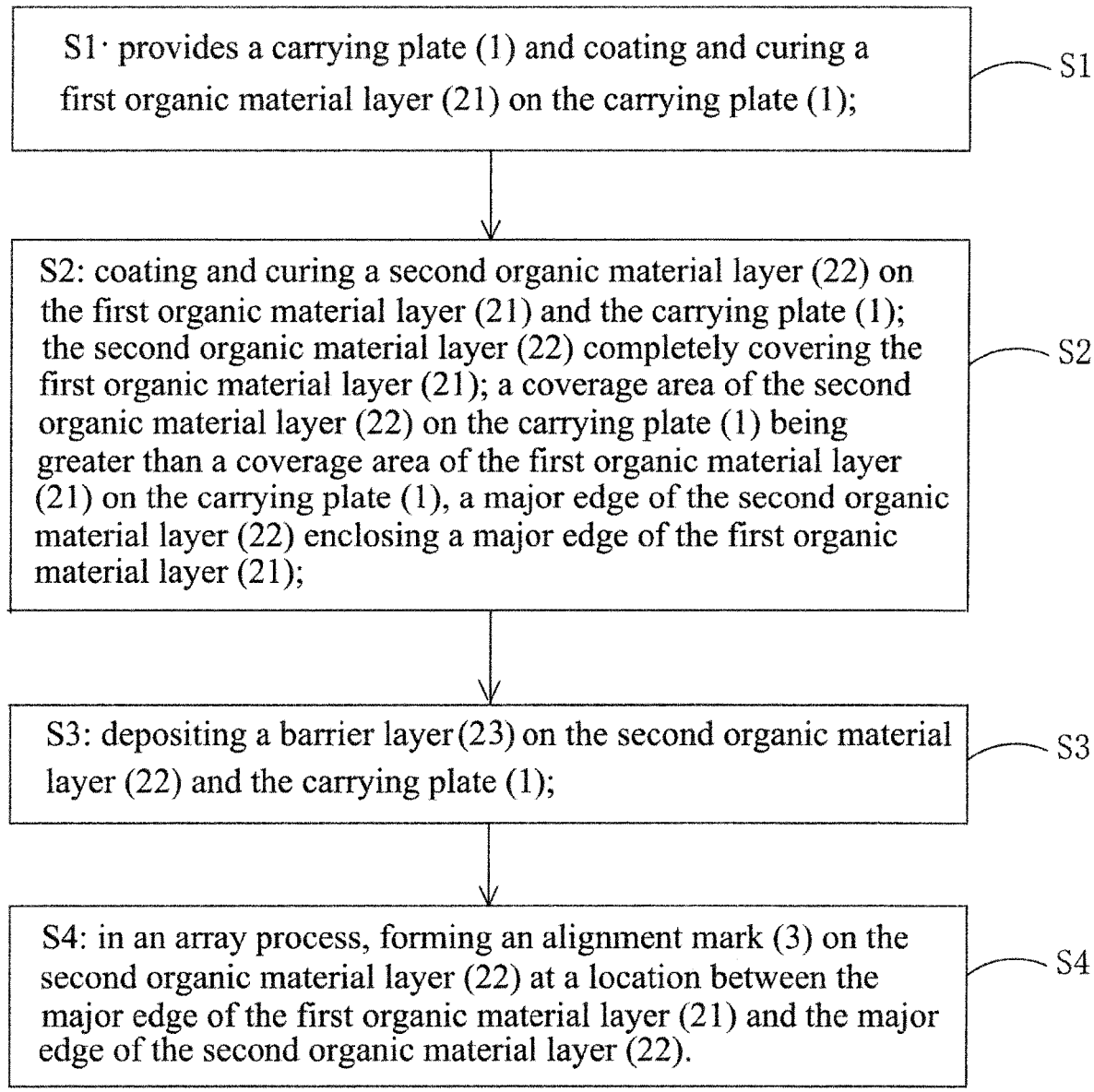
FIG. 3 is a flow chart illustrating a manufacturing method of a flexible substrate according to the present invention.

Referring to FIG. 3, in combination with FIGS. 1 and 2, the present invention also provides a manufacturing method of the flexible substrate, which comprises the following steps:

Step S1: provides a carrying plate 1 and coating and curing a first organic material layer 21 on the carrying plate 1.

Specifically, the carrying plate 1 is preferably a glass plate; and the first organic material layer 21 is formed of a material that comprises, but is not limited to, PI.

Step S2: coating and curing a second organic material layer 22 on the first organic material layer 21 and the carrying plate 1.

Specifically, the second organic material layer 22 is formed of a material that comprises, but is not limited to, PI. The second organic material layer 22 completely covers the first organic material layer 21; a coverage area of the second organic material layer 22 on the carrying plate 1 is greater than a coverage area of the first organic material layer 21 on the carrying plate 1 and a major, long edge of the second organic material layer 22 encloses a major, long edge of the first organic material layer 21. Further, a distance of the major, long edge of the second organic material layer 22 from the corresponding major, long edge of the first organic material layer 21 is not less than 3 mm in order to ensure flatness of an area on which an alignment mark 3 is formed in a subsequent step.

Step S3: depositing a barrier layer on the second organic material layer 22 and the carrying plate 1.

And, Step S4: in an array process, forming an alignment mark 3 on the second organic material layer 22 at a location between the major, long edge of the first organic material layer 21 and the major, long edge of the second organic material layer 22.

Specifically, the alignment mark 3 is formed of a black light-shielding material. The formation of the alignment mark 3 is only on the second organic material layer 22 and does not overlap the first organic material layer 21 in a direction substantially perpendicular to the carrying plate 1.

A flexible substrate manufactured with such a method comprises a first organic material layer 21 and a second organic material layer 22 that completely covers the first organic material layer 21, and may help reduces the thickness of the flexible substrate at an edge, prevents etching residue occurring at an edge of the flexible substrate, and also reduce the coverage area of the organic materials on the carrying plate 1 to reduce warpage of the flexible substrate. In case of film shrinking occurring in the flexible substrate, the presence of the alignment mark 3 helps ensure alignment accuracy in subsequent processes, such as vapor deposition. Further, since there is only one layer of organic material at the site of the alignment mark 3, light transmission rate is increased to thereby improve reflection rate at the alignment mark 3 and thus enhance the rate of successful alignment.

In summary, the present invention provides a flexible substrate, in which the flexible substrate is divided into a first organic material layer and a second organic material layer, and a coverage area of the second organic material layer on a carrying plate is greater than a coverage area of the first organic material layer on the carrying plate and a major, long edge of the second organic material layer encloses a major, long edge of the first organic material layer to help reduce the thickness of an edge of the flexible substrate and prevent etching residue at an edge, reduce the coverage area of the organic materials on the carrying plate, and reduce warpage of the flexible substrate. Further, an alignment mark is formed on the second organic material layer at a location between the major, long edge of the first organic material layer and the major, long edge of the second organic material layer such that in case of film shrinking occurring in the flexible substrate, it is possible to ensure alignment accuracy in subsequent processes, such as vapor deposition. Further, since there is only one layer of organic material at the site of the alignment mark, light transmission rate is increased to thereby improve reflection rate at the alignment mark and thus enhance the rate of successful alignment. The present invention provides a manufacturing method of a flexible substrate, in which a flexible substrate is coated with two layers and a flexible substrate manufactured with such a method has relatively high alignment accuracy and product yield, relatively high light transmission rate, better successful rate of alignment, reduced warpage, and less etching residue occurring at an edge.

Based on the description given above, those having ordinary skills in the art may easily contemplate various changes and modifications of he technical solution and the technical ideas of the present invention. All these changes and modifications are considered belonging to the protection scope of the present invention as defined in the appended claims.

What is claimed is:

1. A flexible substrate, comprising a first organic material layer laid on a carrying plate and a second organic material layer completely covering the first organic material layer, wherein a coverage area of the second organic material layer on the carrying plate is greater than a coverage area of the first organic material layer on the carrying plate and a major edge of the second organic material layer encloses a major edge of the first organic material layer, and wherein the second organic material layer is provided thereon with an alignment mark at a location between the major edge thereof and the major edge of the first organic material layer.

2. The flexible substrate as claimed in claim 1, wherein the carrying plate comprises a glass plate.

3. The flexible substrate as claimed in claim 1, wherein the first organic material layer and the second organic material layer are each formed of a material comprising polyimide.

4. A manufacturing method of a flexible substrate, comprising the following steps:
   Step S1: provides a carrying plate and coating and curing a first organic material layer on the carrying plate; and
   Step S2: coating and curing a second organic material layer on the first organic material layer and the carrying plate;
   Step S3: depositing a barrier layer on the second organic material layer and the carrying plate; and
   Step S4: in an array process, forming an alignment mark on the second organic material layer at a location between the major edge of the first organic material layer and the major edge of the second organic material layer;
   wherein the second organic material layer completely covers the first organic material layer; and a coverage area of the second organic material layer on the carrying plate is greater than a coverage area of the first organic material layer on the carrying plate and a major edge of the second organic material layer encloses a major edge of the first organic material layer.

5. The manufacturing method of the flexible substrate as claimed in claim 4, wherein the carrying plate comprises a glass plate.

6. The manufacturing method of the flexible substrate as claimed in claim 4, wherein the first organic material layer and the second organic material layer are each formed of a material comprising polyimide.

7. A flexible substrate, comprising a first organic material layer laid on a carrying plate and a second organic material layer completely covering the first organic material layer, wherein a coverage area of the second organic material layer on the carrying plate is greater than a coverage area of the first organic material layer on the carrying plate and a major edge of the second organic material layer encloses a major edge of the first organic material layer;
   wherein the carrying plate comprises a glass plate;
   wherein the first organic material layer and the second organic material layer are each formed of a material comprising polyimide; and
   wherein the second organic material layer is provided thereon with an alignment mark at a location between the major edge thereof and the major edge of the first organic material layer.

* * * * *